United States Patent
Cho et al.

(10) Patent No.: US 7,457,151 B2
(45) Date of Patent: Nov. 25, 2008

(54) PHASE CHANGE RANDOM ACCESS MEMORY (PRAM) DEVICE HAVING VARIABLE DRIVE VOLTAGES

(75) Inventors: Woo-yeong Cho, Suwon-si (KR);
Du-eung Kim, Yongin-si (KR);
Sang-beom Kang, Hwaseong-si (KR);
Choong-keun Kwak, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/319,601

(22) Filed: Dec. 29, 2005

(65) Prior Publication Data

US 2007/0014150 A1    Jan. 18, 2007

(30) Foreign Application Priority Data

Jul. 13, 2005   (KR) ................ 10-2005-0063273

(51) Int. Cl.
*G11C 11/00* (2006.01)
(52) U.S. Cl. .................. 365/163; 365/148; 365/203
(58) Field of Classification Search ............... 365/163, 365/148, 226
See application file for complete search history.

(56) References Cited

U.S. PATENT DOCUMENTS

| | | | |
|---|---|---|---|
| 6,754,107 B2 | 6/2004 | Khouri et al. | |
| 6,873,561 B2 | 3/2005 | Ooishi | |
| 7,085,154 B2* | 8/2006 | Cho et al. | 365/163 |
| 7,106,618 B2* | 9/2006 | Morimoto | 365/148 |
| 2004/0027907 A1* | 2/2004 | Ooishi | 365/226 |
| 2006/0146634 A1* | 7/2006 | Osada et al. | 365/226 |
| 2006/0203541 A1* | 9/2006 | Toda | 365/163 |

FOREIGN PATENT DOCUMENTS

| | | |
|---|---|---|
| EP | 1 548 745 A1 | 6/2005 |
| JP | 2004-234707 | 8/2004 |
| KR | 1020020008916 A | 2/2002 |
| KR | 1020030000126 A | 1/2003 |
| KR | 1020050029013 A | 3/2005 |

* cited by examiner

*Primary Examiner*—VanThu Nguyen
*Assistant Examiner*—Han Yang
(74) *Attorney, Agent, or Firm*—Volentine & Whitt, PLLC

(57) ABSTRACT

A phase change memory device of one aspect includes a memory array including a plurality of phase change memory cells, a write boosting circuit, and a write driver. The write boosting circuit boosts a first voltage and outputs a first control voltage in response to a control signal in a first operation mode, and boosts the first voltage and outputs a second control voltage in response to the control signal in a second operation mode and a third operation mode. The write driver is driven by the first control voltage in the first operation mode and writes data to a selected memory cell of the memory array.

23 Claims, 4 Drawing Sheets

PHASE CHANGE RANDOM ACCESS MEMORY (PRAM) DEVICE HAVING VARIABLE DRIVE VOLTAGES

BACKGROUND OF THE INVENTION

1. Field of the Invention

The present invention relates to a phase change memory device, and more particularly, to a phase change memory device which is capable of changing a driving voltage according to an operation mode.

This application claims the benefit of Korean Patent Application No. 10-2005-0063273, filed on Jul. 13, 2005, in the Korean Intellectual Property Office, the disclosure of which is incorporated herein in its entirety by reference.

2. Description of the Related Art

A phase-change random access memory (PRAM), also known as an Ovonic Unified Memory (OUM), includes a phase-change material such as a chalcogenide alloy which is responsive to energy (e.g., thermal energy) so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

FIGS. 1A and 1B illustrate a memory cell 10 in a 'set' state and in a 'reset' state, respectively, and FIG. 2 is an equivalent circuit diagram of the same. In this example, the memory cell 10 includes a phase-change resistive element 11 and a transistor 20 connected in series between a bit line BL and a reference potential (ground), with a gate of the transistor 20 being connected to a word line WL. It should be noted that FIGS. 1A and 1B are general schematic views only, that the configuration of the phase-change resistive element 11 is presented as an example only, and that other configurations and connections with respect to the phase-change resistive element 11 are possible. As an example of one variation, the phase-change resistive element 11 may instead be connected in series with a diode between the bit line BL and the word line WL.

In each of FIGS. 1A and 1B, the phase-change resistive element 11 includes a top electrode 12 formed on a phase-change material 14. In this example, the top electrode 12 is electrically connected to a bit line BL of a PRAM memory array (not shown). A conductive bottom electrode contact (BEC) 16 is formed between the phase-change material 14 and a conductive bottom electrode 18. The transistor 20 is electrically connected between the bottom electrode 18 and the ground potential.

In FIG. 1A, the phase-change material 14 is illustrated as being in its crystalline state. As described previously, this means that the memory cell 10 is in a low-resistance 'set' state or logic 0 state. In FIG. 1B, a portion of the phase-change material 14 is illustrated as being amorphous. Again, this means that the memory cell 10 is in a high-resistance 'reset' state or logic 1 state.

The set and reset states of the memory cell 10 of FIGS. 1A and 1B are established by controlling the magnitude and duration of current flow through the BEC 16. That is, the phase-change resistive element 11 is activated (or accessed) by operation of transistor 20 which is responsive to a voltage of the word line WL. When activated, the memory cell 10 is programmed according to the voltage of the bit line BL. The bit line BL voltage is controlled to establish a programming current ICELL (FIG. 2) which causes the BEC 16 to act as a resistive heater which selectively programs the phase-change material 14 in its 'set' and 'reset' states.

FIG. 3 is a circuit diagram of a conventional phase change memory device 300.

Referring to FIG. 3, the phase change memory device 300 includes a memory array 310, a write driver WD, a column decoder YD, a row decoder XD, and a sense amplifier SAU.

The memory array 310 includes a plurality of memory cells 10, a plurality of bit lines BL, and a plurality of column selection transistors CSTR. Each of the memory cells 10 is comprised of a phase change element 11 and a transistor CTR connected between a corresponding bit line BL and a reference potential VSS (e.g., ground). The gate of each transistor CTR is connected to a node NC, which is driven by an output of the row decoder XD according to a row address signal XADD.

Each bit line BL is selectively connected to a control node NA by respective column selection transistors CSTR. The column selection transistors CSTR operate under control of the column decoder YD, which drives a node NB in response to a column address signal YADD.

The write driver WD writes data to the memory cells 10 in a write operation mode. An exemplary structure of the write driver WD is disclosed in Korean Patent Application No. 2004-45849, and a detailed description thereof is omitted for the sake of brevity.

In operation, the row decoder XD controls a voltage at node NC of each word line WL so as to select a word line WL of a selected memory cell 10 to or from which data will be written or read in response to a row address XADD. A word line WL is selected by application of a high level voltage thereto. The non-selected word lines WL receive a low level voltage.

The column decoder YD controls a voltage of a node NB to which a gate of a column selection transistor CSTR is connected, thus connecting or disconnecting the memory cell 10 to or from the control node NA.

The sense amplifier SAU senses the voltage of the node NA to measure a data value when a data read operation is performed. The sense amplifier SAU includes a sense amplifier circuit S/A, a bias transistor BTR connected between an input terminal of the sense amplifier circuit S/A and a sense amplifier supply voltage VCC, and a clamp transistor PTR connected between the node NA and the input terminal of the sense amplifier circuit S/A. A reference voltage VREF is applied to the other input terminal of the sense amplifier circuit S/A.

The bias transistor BTR is turned on by a bias voltage VBIAS in a read operation to supply a read current to a selected memory cell. The clamp transistor PTR is turned on by a clamp voltage VCLAMP in a read operation mode to maintain the node NA at a clamp voltage VCLAMP minus a threshold voltage of a transistor PTR.

As shown in FIG. 3, the write driver WD, the column decoder YD, and the row decoder XD are driven by the supply voltage VCC.

However, in a write operation mode, the phase change memory device 300 must maintain high level voltages at the nodes NA, NB, and NC of FIG. 3 in order to ensure sufficient current to reliably induce a phase transformation of the phase change material each memory cell. On the other hand, it is necessary generate a relatively low drive voltage to reliably execute in a read operation mode, and to generate a low level voltage in a standby mode to minimize power consumption caused by leakage current in the standby mode. These differing voltage requirements can result in complicated circuit schemes and manufacturing processes.

SUMMARY OF THE INVENTION

According to an aspect of the present invention, a phase change memory device is provided which includes a memory array including a plurality of phase change memory cells, a write boosting circuit, and a write driver. The write boosting circuit boosts a first voltage and outputs a first control voltage in response to a control signal in a first operation mode, and boosts the first voltage and outputs a second control voltage in response to the control signal in a second operation mode and a third operation mode. The write driver is driven by the first control voltage in the first operation mode and writes data to a selected memory cell of the memory array.

According to another aspect of the present invention, a phase change memory device is provided which includes a memory array including a plurality of phase change memory cells, a write driver which writes data to a selected memory cell among the memory cells, a column decoder which selects a bit line connected to the selected memory cell, and a row decoder which selects a word line connected to the selected memory cell. In a first operation mode, the write driver, the column decoder and the row decoder are driven by at least one boosted voltage which is greater than a first voltage. In a second operation mode and a third operation mode, the column decoder and the row decoder are driven by the first voltage.

According to still another aspect of the present invention, a phase change memory device is provide which includes a memory array including a plurality of phase change memory cells, a write driver which writes data to the memory array, a column decoder which selects a bit line of a memory cell to which the data is written, and a row decoder which selects a word line of a memory cell to which the data is written. The write driver, the column decoder, and the row decoder are respectively driven by separate voltage generators.

According to yet another aspect of the present invention, a phase change memory device is provided which includes a memory array including a plurality of phase change memory cells each composed of a phase change element and a cell transistor, a plurality column selection transistors each connecting a bit line connected to the phase change memory cells to a corresponding data line, and a control node connecting the data line to a sense amplifier. In a first operation mode, corresponding control voltages among control voltages obtained by boosting a first voltage are respectively applied to the control node, a gate of the column selection transistor, and a gate of a cell transistor of a selected phase change memory cell.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
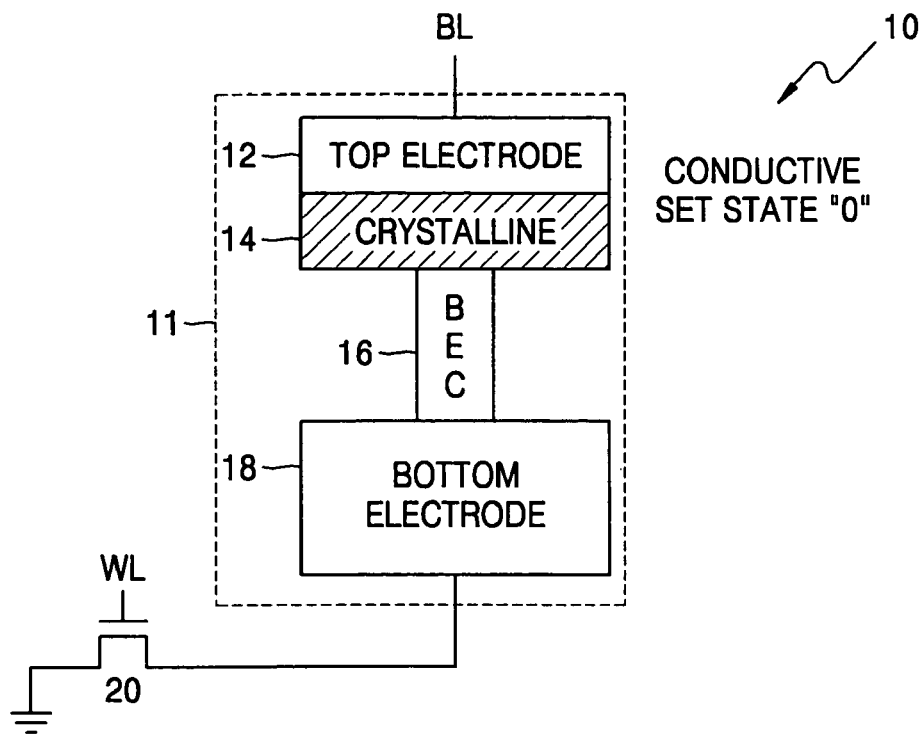
FIGS. 1A and 1B are schematic views of a phase change memory cell with a phase change material having a crystalline state and an amorphous state.
Figure 1B:
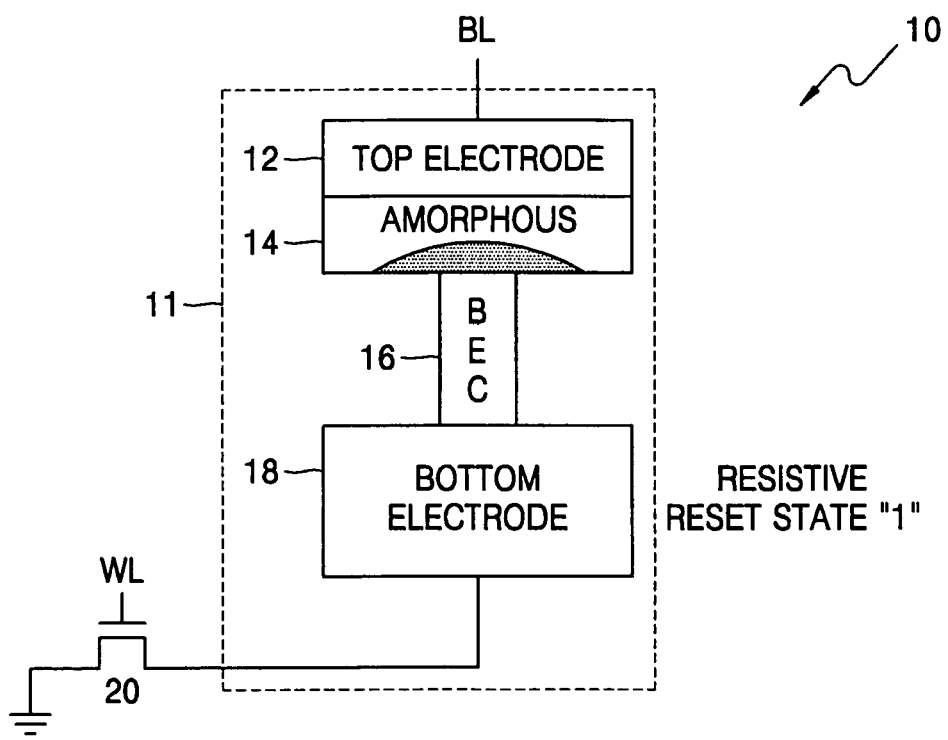
Figure 2:
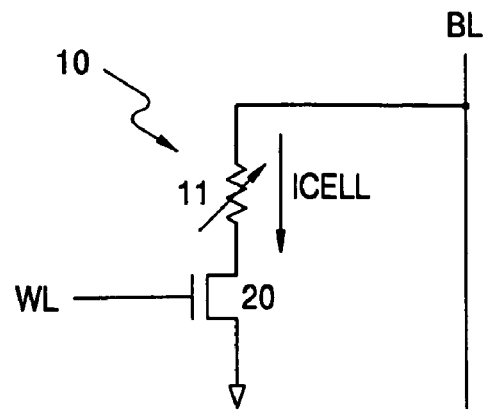
FIG. 2 is an equivalent circuit diagram of the phase change memory cell illustrated in FIG. 1.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their descriptions will not be repeated.

Figure 4:
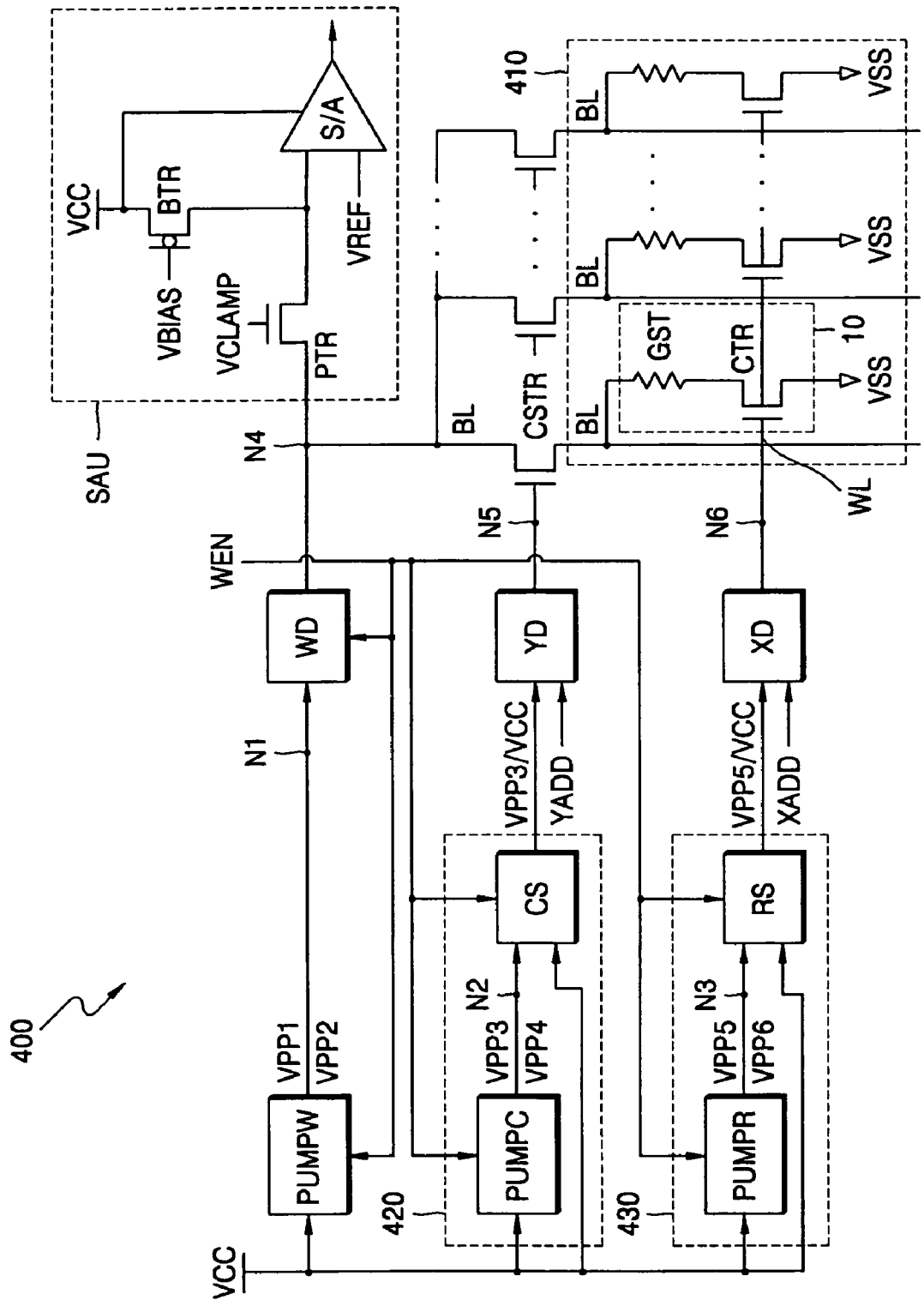
FIG. 4 is a view showing the structure of a phase change memory device according to an embodiment of the present invention.

FIG. 4 is a view showing the structure of a phase change memory device 400 according to an embodiment of the present invention.

The phase change memory device 400 includes a memory array 410, a plurality of column selection transistors CSTR, a word line driver WD, a sense amplifier unit SAU, a column decoder YD, a row decoder XD, a write boosting circuit PUMPW, a column boosting controller 420, and a row boosting controller 430.

The write boosting circuit PUMPW generates a boosted voltage VPP1/VPP2 at a node N1.

The column boosting controller 420 includes a column boosting circuit PUMPC and a column selecting unit CS. The column selecting unit CS receives a supply voltage VCC and a boosted voltage VPP3/VPP4 (at node N2) from the column boosting circuit PUMPC.

The row boosting controller 430 includes a row boosting circuit PUMPR and a row selecting unit RS. The row selecting unit CS receives a supply voltage VCC and a boosted voltage VPP5/VPP6 (at node N3) from the row boosting circuit PUMPR.

Each of the write boosting circuit PUMPW, the column boosting circuit PUMPC, the row boosting circuit PUMPR, the column selecting unit CS, and the row selecting unit RS, are operatively responsive to a control signal WEN.

The memory array 410 includes a plurality of memory cells 10, a plurality of bit lines BL, and a plurality of word lines WL. Each of the memory cells 10 is comprised of a phase change element 11 and a transistor CTR connected between a corresponding bit line BL and a reference potential VSS (e.g., ground).

The gate of each transistor CTR is connected to a corresponding word line WL, which in turn is connected to a control node N4 driven by an output of the row decoder XD according to a row address signal XADD. The phase change element 11 of each memory cell 10 includes, for example, a phase change material of germanium (Ge), antimony (Sb) and tellurium (Te).

Each bit line BL is selectively connected to a control node NA by respective column selection transistors CSTR. The column selection transistors CSTR operate under control of the column decoder YD, which drives a node N5 in response to a column address signal YADD.

The write driver WD is driven by the voltage at node N1, and writes data to the memory cells 10 in a write operation mode by controlling the voltage of the control node N4.

The row decoder is driven by the output of the row selecting unit RS. In operation, the row decoder XD controls a voltage at node N6 of each word line WL so as to select a word line WL of a selected memory cell 10 to or from which data will be written or read in response to a row address XADD. Generally, a word line WL is selected by application of a high level voltage thereto. The non-selected word lines WL receive a low level voltage.

The column decoder YD is driven by the output of the column selecting unit CS. The column decoder YD controls a voltage of a node N5 to which a gate of a column selection transistor CSTR is connected, thus connecting or disconnecting the memory cell 10 to or from the control node N4.

The sense amplifier SAU senses the voltage of the control node N4 to measure a data value when a data read operation is performed. The sense amplifier SAU includes a sense amplifier circuit S/A, a bias transistor BTR connected between an input terminal of the sense amplifier circuit S/A and a sense amplifier supply voltage VCC, and a clamp transistor PTR connected between the node N4 and the input terminal of the sense amplifier circuit S/A. A reference voltage VREF is applied to the other input terminal of the sense amplifier circuit S/A.

The bias transistor BTR is turned on by a bias voltage VBIAS in a standby mode to maintain the input terminal of the sense amplifier at the sense amplifier supply voltage VSA. The clamp transistor PTR is turned on by a clamp voltage VCLAMP in a read operation mode to maintain the node NA at a clamp voltage VCLAMP minus a threshold voltage of a transistor PTR.

As described above and as shown in FIG. 4, the write driver WD, the column decoder YD, and the row decoder XD are respectively driven by the write boosting circuit PUMPW, the column boosting controller 420, and the row boosting controller 430. As will be described in more detail later, these boosting circuits output high voltages dependent on an operational mode of the phase change memory device.

Figure 5:
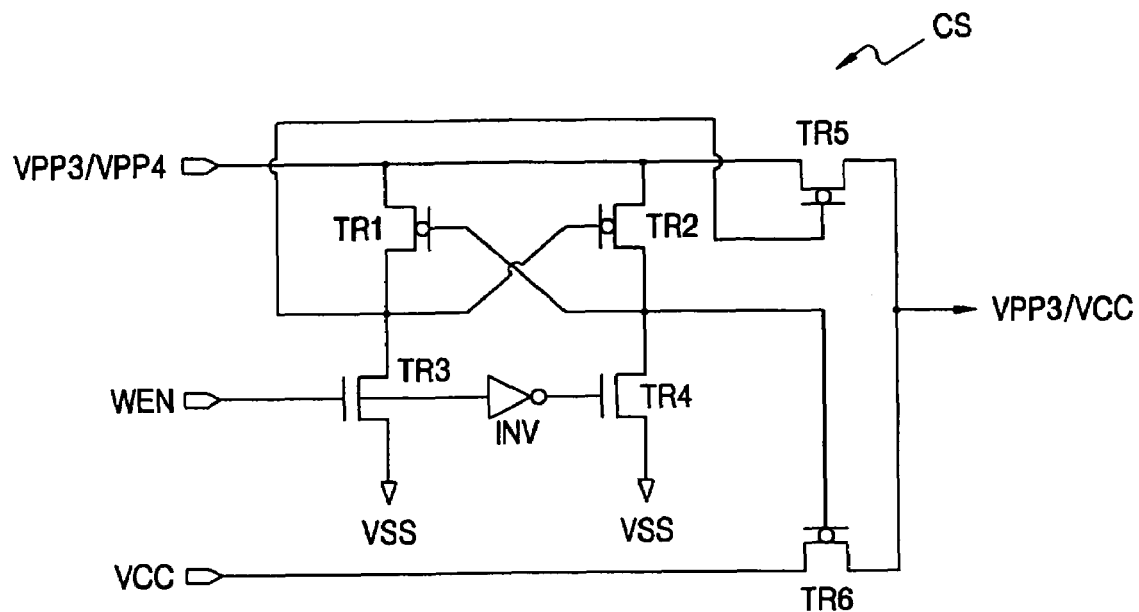
FIG. 5 is a circuit diagram of a column selection unit illustrated in FIG. 4.

FIG. 5 is a circuit diagram of the column selection unit CS illustrated in FIG. 4. The column selection unit CS includes first through sixth transistors TR1 through TR6 and an inverter INV. In a write operation mode, if the control signal WEN goes high, the third transistor TR3 is turned on and the fourth transistor TR4 is turned off by the inverter INV. When the third transistor TR3 is turned on, a node between the third transistor TR3 and the first transistor TR1 is grounded (VSS) and the fifth transistor TR5 is turned on, thus outputting the first control voltage VPP3.

On the contrary, if the control signal WEN goes low, the fourth transistor TR4 is turned on by the inverter INV and a node between the fourth transistor TR4 and the second transistor TR2 is grounded (VSS). Thus, the sixth transistor TR6 is turned on and the first voltage VCC is output.

The configuration of the row selection unit RS is the same as that of the column selection unit CS. The column selection unit CS and the row selection unit RS act as a multiplexer for selecting one of two voltages received in response to a control signal WEN. The configuration of the column selection unit CS is not limited to the circuit structure illustrated in FIG. 5.

Figure 6:
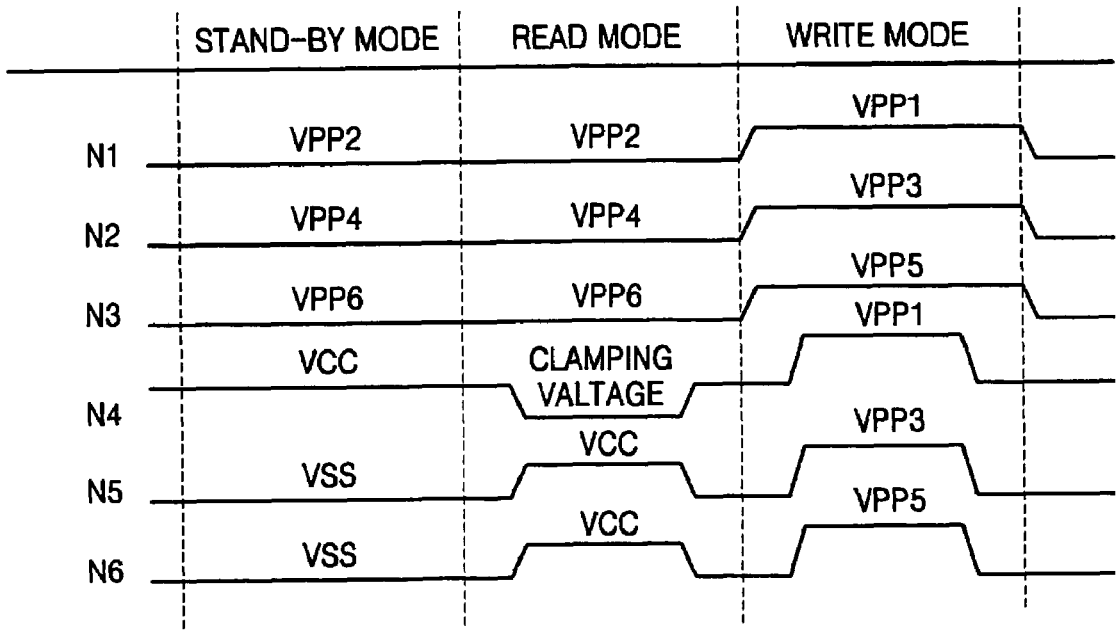
FIG. 6 illustrates voltages which are applied to respective nodes of the phase change memory device illustrated in FIG. 4 according to operation modes.

FIG. 6 illustrates voltages which are applied to the respective nodes N1 through N6 of the phase change memory device 400 illustrated in FIG. 4.

Hereinafter, the operation of the phase change memory device 400 according to an embodiment of the present invention will be described with reference to FIGS. 4, 5 and 6.

The write boosting circuit PUMPW boosts a first voltage VCC and outputs a first control voltage VPP1 in response to the control signal WEN in a first operation mode, and boosts the first voltage VCC and outputs a second control voltage VPP2 in response to the control signal WEN in a second operation mode or a third operation mode. The write driver WD writes data to a selected memory cell 10 in response to the first control voltage VPP1.

The first operation mode may be a write operation mode, the second operation mode may be a read operation mode, and the third operation mode may be a standby mode. For the convenience of description, hereinafter, the first, second and third operation modes are respectively referred to as a write operation mode, a read operation mode and a standby mode.

In the example of this embodiment, the control signal WEN is a write enable signal and the first voltage VCC is a supply voltage. The supply voltage VCC can be an external voltage or a voltage generated by an internal voltage generator (not shown) in response to an external voltage.

Hereinafter, the operation of the phase change memory device 400 in the write operation mode will be described. In the write operation mode, it is assumed that a memory cell 10 of the memory array 410 is selected in response to a row address XADD and a column address YADD.

In the write operation mode, in order to drive the write driver WD, the column decoder YD and the row decoder XD, each of the write boosting circuit PUMPW, the column boosting controller 420 and the row boosting controller 430 are operative.

The row boosting controller 430 boosts a first voltage VCC and outputs a fifth control voltage VPP5 in response to the control signal WEN in the write operation mode.

As previously described, the row boosting controller 430 includes the row boosting circuit PUMPR and the row selection unit RS. The row boosting circuit PUMPR generates a fifth control voltage VPP5 in response to the control signal WEN in the first operation mode, and boosts the first voltage VCC and outputs a sixth control voltage VPP6 in the second operation mode or the third operation mode.

The row selection unit RS selectively outputs the fifth control voltage VPP5 or the first voltage VCC in response to the control signal WEN. Since the control signal WEN is a write enable signal, it is activated in the first operation mode, that is, in the write operation mode.

The row boosting controller 430 boosts the first voltage VCC and outputs the fifth control voltage VPP5 when the control signal WEN is activated. The row selection unit RS outputs the fifth control voltage VPP5 when the control signal WEN is activated, and outputs the first voltage VCC when the control signal WEN is deactivated. The configuration of the row selection unit RS is the same as that of a column selection unit CS and will be described later.

The fifth control voltage VPP5 output from the row selection unit RS drives the row decoder XD, and the row decoder XD applies a voltage to the sixth node N6 connected to the gate of the cell transistor CTR of the memory cell 10 corresponding to an input row address XADD, thus selecting the memory cell 10.

Figure 3:
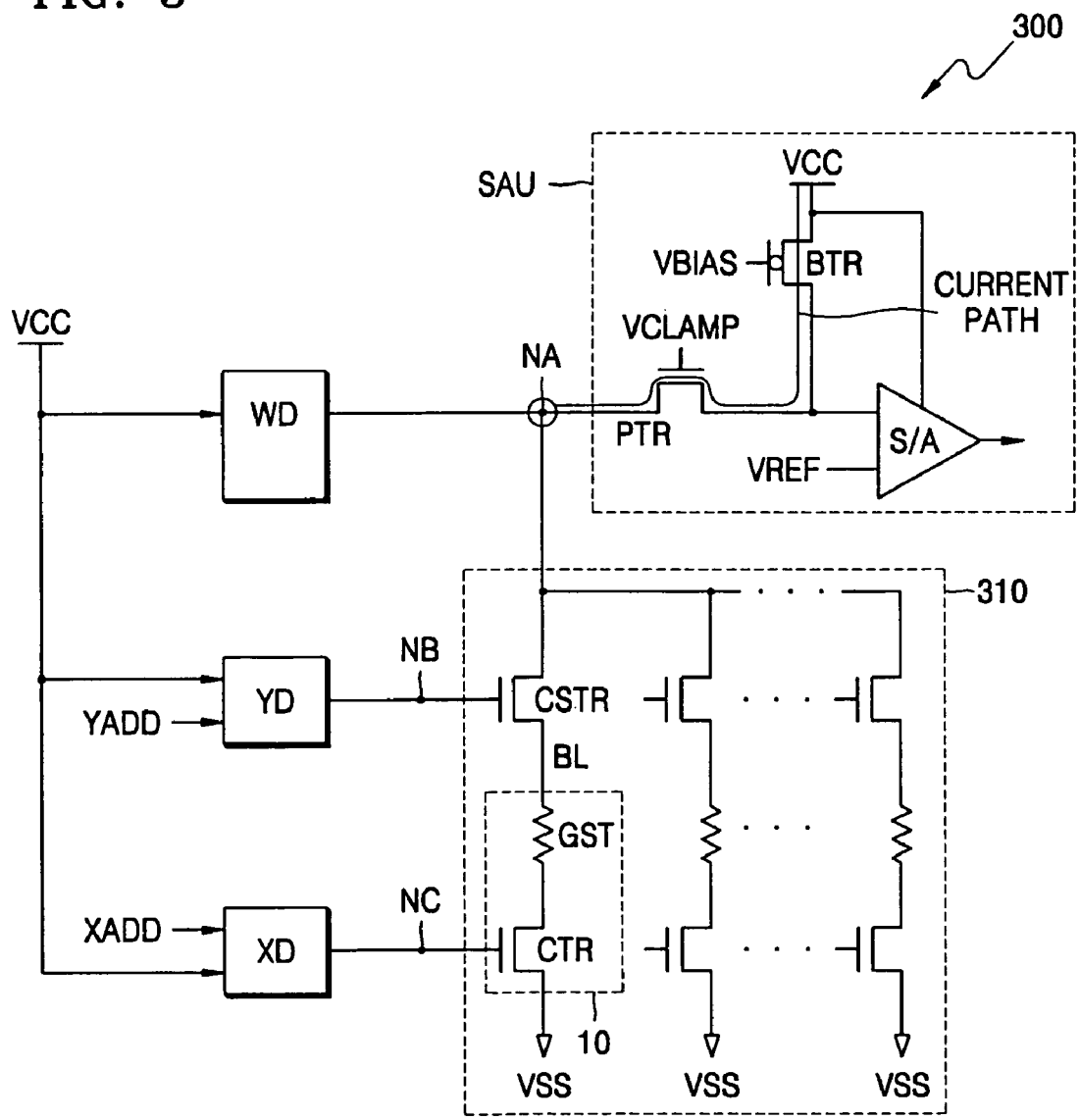
FIG. 3 is a view showing the structure of a conventional phase change memory device.

The voltage applied to the sixth node N6 depends on the fifth control voltage VPP5. The fifth control voltage VPP5 is a sufficiently high voltage to activate a word line WL connected to the selected memory cell 10. For example, the fifth control voltage VPP5 may be between 3 and 5 V. The cell transistor CTR of the memory cell 10 is strongly turned on by the fifth control voltage VPP5, compared to when the phase change memory device 300 illustrated in FIG. 3 is in the write operation mode.

The column boosting controller 420 boosts the first voltage VCC and outputs a third control voltage VPP3 in response to the control signal WEN in the first operation mode, and outputs the first voltage VCC in response to the control signal WEN in the second operation mode and the third operation mode.

The column decoder YD selects the bit line BL connected to the memory cell 10 selected by the column address YADD in response to the third control voltage VPP3 in the write operation mode, selects the bit line BL connected to the memory cell 10 selected by a column address YADD in response to the first voltage VCC in the read operation mode, and does not operate in the standby mode. As previously described, the column boosting controller 420 includes the column boosting circuit PUMPC and the column selection unit CS.

The column boosting circuit PUMPC generates the third control voltage VPP3 in response to the control signal WEN in the write operation mode, and boosts the first voltage VCC and outputs a fourth control voltage VPP4 in the read operation mode and the standby mode.

The column selection unit CS selectively outputs the third control voltage VPP3 or the first voltage VCC in response to the control signal WEN. Since the control signal WEN is a write enable signal, it is activated in the first operation mode, that is, in the write operation mode. The column boosting controller 420 boosts the first voltage VCC and outputs the third control voltage VPP3 when the control signal WEN is activated. The column selection unit CS selects the third control voltage VPP3 and applies it to the column decoder YD when the control signal WEN is activated.

The column decoder YD, which is driven by the third control voltage VPP3, applies to the fifth node N5 a voltage for turning on a switch for selecting a bit line BL connected to a memory cell 10. Here, the switch is a column selection transistor CSTR. The voltage applied to the fifth node N5 depends on the third control voltage VPP3.

The third control voltage VPP3 is a high voltage sufficient to turn on a switch for selecting a bit line BL connected to a selected memory cell 10. For example, the third control voltage VPP3 is between 3 and 5 V.

The column selection transistor CSTR for connecting the memory cell 10 with the fourth node N4 is strongly turned on by the third control voltage VPP3, compared to when the phase change memory device 300 illustrated in FIG. 3 is in the write operation mode.

In the write operation mode, the write boosting circuit PUMPW boosts the first voltage VCC and outputs the first control voltage VPP1 in response to the control signal WEN. The write driver WD applies a write voltage to the fourth node N4 in response to the first control voltage VPP1.

The write voltage depends on the first control voltage VPP1, and the first control voltage VPP1 is a sufficiently high voltage to change the state of the phase change material of the memory cell 10. For example, the first control voltage VPP1 is between 3 and 5 V.

As such, in the first operation mode, that is, in the write operation mode, the write boosting circuit PUMPW, the column boosting circuit PUMPC and the row boosting circuit PUMPR apply the first control voltage VPP1, the third control voltage VPP3 and the fifth control voltage VPP5, respectively, to the first node N1, the second node N2 and the third nodes N3, when the control signal WEN is activated.

Thus, the write driver WD, the column decoder YD and the row decoder XD control the fourth, fifth and sixth nodes N4, N5 and N6 using a higher voltage compared to the phase change memory device 300 illustrated in FIG. 3, in response to the first control voltage VPP1, the third control voltage VPP3 and the fifth control voltage VPP5. Accordingly, current loss occurring in the write operation mode can be reduced.

Hereinafter, the operation of the phase change memory device 400 in a read operation mode and in a standby mode will be described. In the read operation mode, it is assumed that a memory cell 10 of the memory cell array 410 is selected.

In the read operation mode and the standby mode, the control signal WEN is deactivated and the write driver WD does not operate. The write boosting circuit PUMPW applies the second control voltage VPP2 to the first node N1 when the control signal WEN is deactivated. The second control voltage VPP2 is lower than the first control voltage VPP1 and higher than the first voltage VCC. For example, the second control voltage VPP2 is between the first voltage VCC and 3 V.

The second control voltage VPP2 allows the write boosting circuit PUMPW to generate the first control voltage VPP1 in a short time when the phase change memory device 400 enters the write operation mode. In different modes other than the write operation mode, the phase change memory device 400 boosts the first voltage VCC and generates the second control voltage VPP2, which is lower than the first control voltage VPP1, so as to quickly generate the first control voltage VPP1 when conversion into the write operation mode occurs.

In the standby mode, the bias transistor BTR is turned on by a bias voltage VBIAS and maintains the fourth node N4 at the first voltage VCC. In the read operation mode, the clamp transistor PTR is turned on in response to a claim voltage VCLAMP, so as to maintain the fourth node N4 at a predetermined clamping voltage.

The operation of maintaining the fourth node N4 at the clamp voltage VCLAMP in the read operation mode is well known to those of ordinary skill in the art and therefore a detailed description thereof is omitted.

The column boosting circuit PUMPC boosts the first voltage VCC and outputs a fourth control voltage VPP4 to the node N2 when the control signal WEN is deactivated, i.e., in the read operation mode and the standby operation mode. The fourth control voltage VPP4 is lower than the third control voltage VPP3 and higher than the first voltage VCC. For example, the fourth control voltage VPP4 is between the first voltage VCC and 3 V.

Like the second control voltage VPP2, the fourth control voltage VPP4 allows the column boosting circuit PUMPC to generate the third control voltage VPP3 in a short time when the phase change memory device 400 enters the write operation mode.

That is, in different modes other than the write operation mode, the phase change memory device 400 boosts the first voltage VCC and generates the fourth control voltage VPP4, which is lower than the third control voltage VPP3, so as to quickly generate the third control voltage VPP3 when conversion into the write operation mode occurs.

In the read operation mode, the column selection unit CS selects the first voltage VCC and outputs it to the column decoder YD. Also, the column decoder YD controls the voltage of the fifth node N5 connected to the gate of the column selection transistor CSTR in response to the first voltage VCC. Accordingly, the column selection transistor CSTR is turned on and transfers data read from the memory cell 10 to the fourth node N4.

In the write operation mode, the column selection transistor CSTR is turned on in response to the third control voltage VPP3, however, in the read operation mode, the column selection transistor CSTR is turned on in response to the first voltage VCC.

In the standby mode, although the column decoder YD receives the first voltage VCC from the column selection unit CS, the column decoder YD does not operate, the column selection transistor CSTR is not selected and the fifth node N5 is grounded (VSS).

The row boosting circuit PUMPR boosts the first voltage VCC and outputs the sixth voltage VPP6 to the third node N3 when the control signal WEN is deactivated, in the read operation mode and the standby mode. The sixth control voltage VPP6 is lower than the fifth control voltage VPP5 and higher than the first voltage VCC. For example, the sixth control voltage VPP6 is between the first voltage VCC and 3 V.

Like the second control voltage VPP2, the sixth control voltage VPP6 allows the row boosting circuit PUMPR to generate the fifth voltage VPP5 in a short time when the phase change memory device 400 enters the write operation mode.

That is, in modes other than the write operation mode, the phase change memory device 400 boosts the first voltage VCC and generates the sixth control voltage VCC6, so as to quickly generate the fifth control voltage VPP5 when conversion into the write operation mode occurs.

In the read operation mode, the row selection unit RS selects the first voltage VCC and outputs it to the row decoder XD. The row decoder XD controls the voltage of the sixth node N6 connected to the gate of the cell transistor CTR of a memory cell 10 in response to the first voltage VCC. Accordingly, the cell transistor CTR is turned on.

In the write operation mode, the cell transistor CTR is turned on in response to the fifth control voltage VPP5, however, in the read operation mode, the cell transistor CTR is turned on in response to the first voltage VCC.

In the standby mode, although the row decoder XD receives the first voltage VCC from the row selection unit RS, the row decoder XD does not operate, the cell transistor CTR is not selected and the sixth node N6 is grounded (VSS).

Each of the write boosting circuit PUMPW, the column boosting circuit PUMPC and the row boosting circuit PUMPR, which generates a different control voltage according to an operation mode in response to the first voltage VCC, may be a well-known differential amplifier boosting circuit, and therefore a detailed description thereof is omitted, but, the present invention is not limited in this manner.

The operations and structures of the column decoder YD and the row decoder XD are well known to those skilled in the art and therefore detailed descriptions thereof are omitted. The voltage values of the first through sixth voltages VPP1 through VPP6 mentioned above are only exemplary and the invention is not limited to the exemplary voltage values.

In the phase change memory device 400, the second, fourth and sixth control voltages VPP2, VPP4 and VPP6 may be referred to as "sub control voltages" which are greater than the first voltage VCC. By setting the second, fourth and sixth sub control voltages VPP2, VPP4 and VPP6 greater than the first voltage VCC, the sub control voltages can be more rapidly boosted to the first, third and fifth control voltages VPP1, VPP3 and VPP5 when the phase change memory device 400 enters the write operation mode. However, the invention is not limited in this fashion and the sub control voltages VPP2, VPP4 and VPP6 can be made equal to VCC, if desired, at the expense of increasing the rise time to the first, third and fifth control voltages VPP1, VPP3 and VPP5 when the phase change memory device 400 enters the write operation mode.

The phase change memory device 400 according to the embodiment of the present invention drives the write driver WD, the column decoder YD and the row decoder XD using a predetermined high voltage in a write operation mode, and drives the write driver WD, the column decoder YD and the row decoder XD using a voltage lower than the predetermined high voltage, in a read operation mode and a standby mode, thereby reducing power consumption when a write operation is performed and enhancing operation reliability.

The present embodiment is directed to a phase change memory device including a phase change material composed of germanium (Ge), antimony (Sb) and tellurium (Te). However, it will be apparent to those skilled in the art that the phase change memory can be made of any material whose state can be changed by applying a current or voltage.

As described above, in a phase change memory device and a driving method thereof according to the present invention, since a sufficient write voltage is supplied to a write driver, a column decoder and a row decoder in a write operation mode and a voltage lower than that applied in the write operation mode is applied to the column decoder and the row decoder in a read operation mode and a standby operation mode, it is possible to reduce current loss and enhance operation reliability.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A phase change memory device which comprises a memory array including a plurality of phase change memory cells each composed of a phase change element and a cell transistor, a plurality column selection transistors each connecting a bit line connected to the phase change memory cells to a corresponding data line, and a control node connecting the data line to a sense amplifier, wherein, in a first operation mode, corresponding control voltages among control voltages obtained by boosting a first voltage are respectively applied to the control node, a gate of the column selection transistor, and a gate of a cell transistor of a selected phase change memory cell.

2. The phase change memory device of claim 1, wherein, in a second operation mode, the first voltage is applied to the gate of the column selection transistor and the gate of the cell transistor, and a clamp voltage is applied to the control node, and wherein, in a third operation mode, a ground voltage is applied to the gate of the column selection transistor and the gate of the cell transistor and the first voltage is precharged to the control node.

3. The phase change memory device of claim 2, further comprising:

a write driver which is driven by a corresponding control voltage and which controls the control node to write data to the phase change memory cell;

a column decoder which is driven by a corresponding control voltage or the first voltage and which controls the column selection transistor; and a row decoder which is driven by a corresponding control voltage or the first voltage and which controls the cell transistor.

4. The phase change memory device of claim 3, further comprising:

boosting circuits respectively corresponding to the write driver, the column decoder and the row decoder, and respectively generating the control voltages in response to a control signal; and selectors respectively corresponding to the column decoder and the row decoder, which select one of a control voltage and the first voltage in response to the control signal, and which apply the selected voltage to the column decoder and the row decoder.

5. The phase change memory device of claim 4, wherein the boosting circuits boost the first voltage and generate sub control voltages in the second operation mode and the third operation mode, and wherein the sub control voltages are lower than the control voltages and higher than the first voltage.

6. The phase change memory of claim 5, wherein the control signal is a write enable signal which is activated in the first operation mode, and deactivated in the second operation mode and the third operation mode, and wherein the first is a write operation mode, the second operation mode is a read operation mode, and the third operation mode is a standby mode.

7. The phase change memory device of claim 1, further comprising:

a write boosting circuit which boosts the first voltage and outputs a first control voltage in response to a control signal first operation mode, and which boosts the first voltage and outputs a second control voltage in response to the control signal in a second operation mode and a third operation mode; and a write driver which is driven by the first control voltage in the first operation mode and which writes data to a selected memory cell of the memory array, wherein the first control voltage is a high voltage sufficient to change the state of a phase change material of the selected memory cell, and the second control voltage is lower than the first control voltage and higher than the first voltage.

8. The phase change memory device of claim 7 wherin the control signal is a write enable signal and the first voltage is a supply voltage.

9. The phase change memory device of claim 7, wherein the first operation mode is a write operation mode, the second operation mode is a read operation mode, and the third operation mode is a standby mode.

10. The phase change memory device of claim 7, further comprising:

a column boosting controller which boosts the first voltage and outputs a third control voltage in response to the control signal in the first operation mode and ouputs the first voltage in response to the control signal in the second operation mode and third operation mode; and a column decoder which is driven by the third control voltage in the first operation mode and the first voltage in the second operation mode, and which selects a bit line connected to the selected memory cell.

11. The phase change memory device of claim 10, wherein the column boosting controller comprises:

a column boosting circuit which generates the third control voltage in response to the control signal in the first operation mode, and which boosts the first voltage and outputs a fourth control voltage in the second operation mode; and a column selection unit which selectively outputs the third control voltage or the first voltage in response to the control signal.

12. The phase change memory device of claim 11, wherein the third control voltage is a high voltage sufficient to activate a switch for selecting the bit line connected to the selected memory cell, and wherein the fourth control voltage is lower than the third control voltage and higher than the first voltage.

13. The phase memory device of claim 7, further comprising:

a row boosting controller which boosts the first voltage and outputs a fifth control voltage in response to the control signal in the first operation mode, and which outputs the first voltage in response to the control signal in the second operation mode and the third operation mode; and a row decoder which is driven by the fifth control voltage in the first operation mode and the first voltage in the second operation mode, and which selects a word line connected to the selected memory cell.

14. The phase change memory device of claim 13, wherein the row boosting controller comprises:

a row boosting circuit which generates the fifth control voltage in response to the control signal in the first operation mode, and which boosts the first voltage and outputs a sixth control voltage in the second operation mode; and a row selector which selectively outputs the fifth control voltage or the first voltage in response to the control signal.

15. The phase change memory device of claim 14, wherein the fifth control voltage is a high voltage sufficient to activate the word line connected to the selected memory cell, and wherein the sixth control voltage is lower than the fifth control voltage and higher than the first voltage.

16. The phase change memory device of claim 7, wherein each of the memory cells includes a phase change element connected in series with a transistor, and wherein the phase change element includes a phase change material including germanium (Ge), antimony (Sb) and tellurium (Te).

17. The phase change memory device of claim 1, further comprising a write driver which writes data to a selected memory cell among the memory cells, a column decoder which selects a bit line connected to the selected memory cell, and a row decoder which selects a word line connected to the selected memory cell, wherein, in the first operation mode, the write driver, the column decoder and the row decoder are driven by at least one boosted voltage which is greater than the first voltage, and wherein, the second operation mode and the third operation mode, the column decoder and the row decoder are driven by the first voltage.

18. The phase change memory device of claim 17, further comprising:

boosting circuits respectively corresponding to the write driver, the column decoder and the row decoder and respectively generating the control voltages in response to a control signal; and selectors respectively corresponding to the column decoder and the row decoder, each selecting one of a corresponding control voltage and the first voltage in response to the control signal, and applying the selected voltage to the column decoder and the row decoder.

19. The phase change memory device of claim 18, wherein the boosting circuits boost the first voltage and generate sub control voltages in the second operation mode and the third operation mode, and wherein the sub control voltages are lower than the control voltages and greater than the first voltage.

20. The phase change memory of claim 18, wherein the control signal is a write enable signal which is activated in the first operation mode and deactivated in the second operation mode and the third operation mode, and wherein the first is a write operation mode, the second operation mode is a read operation mode and the third operation mode is a standby mode.

21. The phase change memory device of claim 1, further comprising a write driver which writes data to the memory array, a column decoder which selects a bit line of a memory cell to which the data is written, and a row decoder which selects a word line of a memory cell to which the data is written, wherein the write driver, the column decoder, and the row decoder are respectively driven by separate voltage generators, wherein the voltge generators generate control voltages obtained by boosting a first voltage in a first operation mode, and generate sub control voltages lower than the control voltages and higher than the first voltage in a second operation mode and a third operation mode.

22. The phase change memory device of claim 21, further comprising selectors respectively connected to the column decoder and the row decoder, each selecting one of a corresponding control voltage and the first voltage in response to a control signal, and applying the selected voltage to the column decoder and the row decoder.

23. The phase change memory device of claim 22, wherein the control signal is a write enable signal which is activated in the first operation mode and deactivated in the second operation mode and the third operation mode, and wherein the first operation mode is a write operation mode, the second operation mode is a read operation mode and the third operation mode is a standby mode.

\* \* \* \* \*